United States Patent
Bateman et al.

(10) Patent No.: US 8,461,032 B2
(45) Date of Patent: Jun. 11, 2013

(54) USE OF DOPANTS WITH DIFFERENT DIFFUSIVITIES FOR SOLAR CELL MANUFACTURE

(75) Inventors: Nicholas Bateman, Burlington, MA (US); Atul Gupta, Beverly, MA (US); Christopher Hatem, Salisbury, MA (US); Deepak Ramappa, Cambridge, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 432 days.

(21) Appl. No.: 12/397,542

(22) Filed: Mar. 4, 2009

(65) Prior Publication Data

US 2009/0227097 A1 Sep. 10, 2009

Related U.S. Application Data

(60) Provisional application No. 61/033,873, filed on Mar. 5, 2008, provisional application No. 61/095,010, filed on Sep. 8, 2008.

(51) Int. Cl.
*H01L 21/425* (2006.01)

(52) U.S. Cl.
USPC ............ 438/530; 257/E21.135; 438/510; 438/529; 438/542; 438/546; 438/547

(58) Field of Classification Search
USPC ............ 438/510, 529, 530, 542, 546, 549, 438/565, 566; 257/E21.135
See application file for complete search history.

(56) References Cited

U.S. PATENT DOCUMENTS

| | | | |
|---|---|---|---|
| 4,086,102 A | 4/1978 | King | |
| 4,140,610 A | 2/1979 | Morimoto | |
| 4,883,767 A * | 11/1989 | Gray et al. | 438/138 |
| 5,040,039 A * | 8/1991 | Hattori et al. | 257/463 |
| 5,532,175 A | 7/1996 | Racanelli et al. | |
| 5,893,742 A | 4/1999 | Demirlioglu et al. | |
| 5,965,929 A | 10/1999 | Gnannt et al. | |
| 6,184,111 B1 | 2/2001 | Henley et al. | |
| 6,204,545 B1 * | 3/2001 | Nakata | 257/459 |
| 7,129,109 B2 * | 10/2006 | Munzer et al. | 438/98 |

(Continued)

FOREIGN PATENT DOCUMENTS

| | | |
|---|---|---|
| JP | 10-261810 A | 9/1998 |
| JP | 2006-310373 A | 11/2006 |

OTHER PUBLICATIONS

Hunt et al., "The effect of mixed arsenic-phosphorous emitters on device properties", 1972, IEEE EDM 1972 International, pp. 96-98.*

(Continued)

*Primary Examiner* — Leonard Chang

(57) ABSTRACT

A method of tailoring the dopant profile of a substrate by utilizing two different dopants, each having a different diffusivity is disclosed. The substrate may be, for example, a solar cell. By introducing two different dopants, such as by ion implantation, furnace diffusion, or paste, it is possible to create the desired dopant profile. In addition, the dopants may be introduced simultaneously, partially simultaneously, or sequentially. Dopant pairs preferably consist of one lighter species and one heavier species, where the lighter species has a greater diffusivity. For example, dopant pairs such as boron and gallium, boron and indium, phosphorus and arsenic, and phosphorus and antimony, can be utilized.

9 Claims, 5 Drawing Sheets

U.S. PATENT DOCUMENTS

| | | | |
|---|---|---|---|
| 7,727,866 B2 * | 6/2010 | Bateman et al. | 438/514 |
| 2009/0068783 A1 * | 3/2009 | Borden | 438/57 |
| 2009/0227061 A1 * | 9/2009 | Bateman et al. | 438/57 |
| 2009/0227062 A1 | 9/2009 | Sullivan et al. | |
| 2009/0227095 A1 * | 9/2009 | Bateman et al. | 438/514 |
| 2009/0308440 A1 * | 12/2009 | Adibi et al. | 136/255 |

OTHER PUBLICATIONS

L. Kreinin, "Combined thermal diffusion—ion implantation fabrication processing for silicon solar cells", Opto-Electronics Review 8(4), 317-322 (2000).*

* cited by examiner

USE OF DOPANTS WITH DIFFERENT DIFFUSIVITIES FOR SOLAR CELL MANUFACTURE

This application claims priority of U.S. Provisional Patent Application Ser. No. 61/033,873, filed Mar. 5, 2008, and U.S. Provisional Patent Application Ser. No. 61/095,010, filed Sep. 8, 2008, the disclosures of which are hereby incorporated by reference.

FIELD

This invention relates to dopant profiles, and, more particularly, to dopant profiles in solar cells.

BACKGROUND

Ion implantation is a standard technique for introducing conductivity-altering impurities into semiconductor substrates. A desired impurity material is ionized in an ion source, the ions are accelerated to form an ion beam of prescribed energy, and the ion beam is directed at the surface of the substrate. The energetic ions in the beam penetrate into the bulk of the semiconductor material and are embedded into the crystalline lattice of the semiconductor material to form a region of desired conductivity.

Solar cells are typically manufactured using the same processes used for other semiconductor devices, often using silicon as the substrate material. A semiconductor solar cell is a simple device having an in-built electric field that separates the charge carriers generated through the absorption of photons in the semiconductor material. This electric field is typically created through the formation of a p-n junction (diode), which is created by differential doping of the semiconductor material. Doping a part of the semiconductor substrate (e.g. surface region) with impurities of opposite polarity forms a p-n junction that may be used as a photovoltaic device converting light into electricity.

FIG. 3 shows a first embodiment of a solar cell, and is a cross section of a representative substrate 300. Photons 301 enter the solar cell 300 through the top surface 305, as signified by the arrows. These photons pass through an anti-reflective coating 310, designed to maximize the number of photons that penetrate the substrate 300 and minimize those that are reflected away from the substrate.

Internally, the substrate 300 is formed so as to have a p-n junction 320. This junction is shown as being substantially parallel to the top surface 305 of the substrate 300 although there are other implementations where the junction may not be parallel to the surface. The solar cell is fabricated such that the photons enter the substrate through a heavily doped region, also known as the emitter 330. In some embodiments, the emitter 330 may be an n-type doped region, while in other embodiments, the emitter may be a p-type doped region. The photons with sufficient energy (above the bandgap of the semiconductor) are able to promote an electron within the semiconductor material's valence band to the conduction band. Associated with this free electron is a corresponding positively charged hole in the valence band. In order to generate a photocurrent that can drive an external load, these electron hole (e-h) pairs need to be separated. This is done through the built-in electric field at the p-n junction. Thus any e-h pairs that are generated in the depletion region of the p-n junction get separated, as are any other minority carriers that diffuse to the depletion region of the device. Since a majority of the incident photons are absorbed in near surface regions of the device, the minority carriers generated in the emitter need to diffuse across the depth of the emitter to reach the depletion region and get swept across to the other side. Thus to maximize the collection of photo-generated current and minimize the chances of carrier recombination in the emitter, it is preferable to have the emitter region 130 be very shallow.

Some photons pass through the emitter region 330 and enter the base 340. In the scenario where the emitter 330 is an n-type region, the base 340 is a p-type doped region. These photons can then excite electrons within the base 340, which are free to move into the emitter region 330, while the associated holes remain in the base 340. Alternatively, in the case where the emitter 330 is a p-type doped region, the base is an n-type doped region. In this case, these photons can then excite electrons within the base 340, which remain in the base region 340, while the associated holes move into the emitter 330. As a result of the charge separation caused by the presence of this p-n junction, the extra carriers (electrons and holes) generated by the photons can then be used to drive an external load to complete the circuit.

By externally connecting the emitter region 330 to the base 340 through an external load, it is possible to conduct current and therefore provide power. To achieve this, contacts 350, typically metallic, are placed on the outer surface of the emitter region and the base. Since the base does not receive the photons directly, typically its contact 350b is placed along the entire outer surface. In contrast, the outer surface of the emitter region 330 receives photons and therefore cannot be completely covered with contacts. However, if the electrons have to travel great distances to the contact, the series resistance of the cell increases, which lowers the power output. In an attempt to balance these two considerations (the distance that the free electrons must travel to the contact, and the amount of exposed emitter surface 360) most applications use contacts 350a that are in the form of fingers. FIG. 4 shows a top view of the solar cell of FIG. 3. The contacts are typically formed so as to be relatively thin, while extending the width of the solar cell. In this way, free electrons need not travel great distances, but much of the outer surface of the emitter is exposed to the photons. Typical contact fingers 350a on the front side of the substrate are 0.1 mm with an accuracy of +/−0.1 mm. These fingers 350a are typically spaced between 1-5 mm apart from one another. While these dimensions are typical, other dimensions are possible and contemplated herein.

A further enhancement to solar cells is the addition of heavily doped substrate contact regions. FIG. 5 shows a cross section of this enhanced solar cell. The cell is as described above in connection with FIG. 3, but includes heavily doped contact regions 370. These heavily doped contact regions 370 correspond to the areas where the metallic fingers 350a will be affixed to the substrate 300. The introduction of these heavily doped contact regions 370 allows much better contact between the substrate 300 and the metallic fingers 350a and significantly lowers the series resistance of the cell. This pattern of including heavily doped regions on the surface of the substrate is commonly referred to as selective emitter design.

A selective emitter design for a solar cell also has the advantage of higher efficiency cells due to reduced minority carrier losses through recombination due to lower dopant/impurity dose in the exposed regions of the emitter layer. The higher doping under the contact regions provides a field that repels the minority carriers generated in the emitter and pushes them towards the p-n junction.

The embodiment shown in FIG. 3 requires contacts on both sides of the substrate, thereby reducing the available area of the front surface through which photons may pass. A cross section of a second embodiment of a solar cell 400 is shown in FIG. 6. Fundamentally, the physics of this embodiment is similar, in which a p-n junction is used to create an electric field which separates the generated electron hole pairs. However, rather than create the p-n junction across the entire substrate, as done in the previous embodiment, the junctions are only created in portions of the substrate 400. In this embodiment, a negatively doped silicon substrate 410 is used. In certain embodiments, a more negatively biased front surface field (FSF) 420 is created by implanting addition n-type dopants in the front surface. This front surface is then coated with an anti-reflective material 430. This front surface is often etched to create a sawtooth or other non-planar surface, so as to increase surface area. The metallic contacts or fingers 470 are all located on the bottom surface of the substrate. Certain portions of the bottom surface are implanted with p-type dopants to create emitters 440. Other portions are implanted with n-type dopants to create more negatively biased back surface field 450. The back surface is coated with a dielectric layer 460 to enhance the reflectivity of the back surface. Metal fingers 470a are attached to the emitter 440 and fingers 470b attaches to the BSF 450. FIG. 7 shows one commonly used configuration of the metal fingers on the back surface. This type of cell is known as an interdigitated back contact (IBC) solar cell.

With current energy costs and environmental concerns, solar cells are becoming increasingly important. Any reduced cost to the manufacturing or production of high-performance solar cells or any efficiency improvement to high-performance solar cells would have a positive impact on the implementation of solar cells worldwide. This will enable the wider availability of this clean energy technology.

Current solar cell design is limited by the dopant profiles that can be achieved by diffusing dopants into the silicon of the solar cell. Thermal diffusion has limited process parameters to control a dopant profile, such as time, temperature, and ramp speed. These thermal diffusion process parameters may not allow the desired tailoring of a dopant profile in a solar cell to achieve solar cell performance requirements. Furthermore, various dopants diffuse differently under a thermal diffusion process. The dopant that is selected may limit possible tailoring of the dopant profile in a solar cell. Accordingly, there is a need in the art for improved dopant profiles solar cells and, more particularly, a method that uses dopants with different diffusivities to tailor dopant profiles in a solar cell.

SUMMARY

The issues in the prior art are alleviated by the disclosed method. By utilizing two different dopants, each having a different diffusivity, the dopant profile of the substrate can be tailored as required. For example, in the case of solar cells, it may be advantageous to have a greater dopant concentration near the surface of the substrate, while still establishing a deep moderately doped region. By introducing two different dopants, such as by implantation, furnace diffusion, or paste, it is possible to create the desired dopant profile. In addition, the dopants may be introduced simultaneously, partially simultaneously or sequentially. Dopant pairs may consist of two species of differing diffusivity. In some embodiments, the dopant pairs may consist of one lighter species and one heavier species, where the lighter species has a greater diffusivity. For example, dopant pairs such as boron and gallium, boron and indium, phosphorus and arsenic, and phosphorus and antimony, can be utilized.

BRIEF DESCRIPTION OF THE DRAWINGS

For a better understanding of the present disclosure, reference is made to the accompanying drawings, which are incorporated herein by reference and in which.

DETAILED DESCRIPTION

Figure 1A:
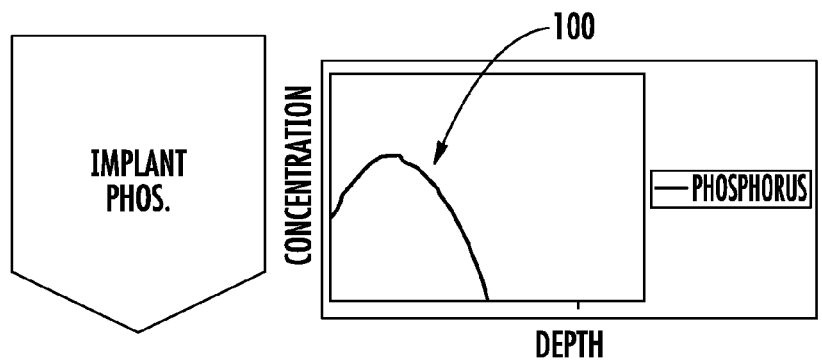
FIG. 1 is a set of graphs showing dopant distribution profiles for phosphorus and arsenic before and after anneal.

The embodiments of the process described herein may be performed by, for example, a beam-line ion implanter or a plasma doping ion implanter. Such a plasma doping ion implanter may use RF or other plasma generation sources. Other plasma processing equipment or equipment that generates ions also may be used. Thermal or furnace diffusion, pastes on the surface of the solar cell substrate that are heated, epitaxial growth, or laser doping also may be used to perform embodiments of the process described herein. Furthermore, while a silicon solar cell is specifically disclosed, other solar cell substrate materials also may benefit from embodiments of the process described herein.

The manufacture of high efficiency solar cells has many, often conflicting, requirements. For example, screen printed contacts typically require specific dopant profiles for proper solar cell performance. These contacts require high interstitial dopant concentrations at the surface of the substrate. Current solar cell manufacturing methods use fired paste contacts with a single dopant, such as phosphorus, to achieve this high concentration. However, achieving a high surface concentration may require a high concentration of the dopant to be introduced throughout the emitter of the solar cell. This high concentration of dopant throughout the emitter increases carrier recombination and, consequently, may lower cell efficiency. Thus, contacts between the emitter and the contacts are improved by introducing high dopant concentrations near the contact regions. However, the introduction of this dopant throughout the emitter degrades solar cell performance.

Another issue is that recombination of e-h pairs at the surface of a solar cell typically limits solar cell efficiency. This recombination can be reduced by repelling minority carriers from the surface of the solar cell. One way to repel minority carriers is to put a shallow, high concentration layer of dopant at the surface of the solar cell. This layer needs to remain in place throughout any subsequent thermal processing. However, previous methods would diffuse this dopant layer throughout the emitter, reducing its effectiveness.

While the above criteria require a shallow, high concentration at the surface of the substrate, other criteria may require a deeper dopant concentration. One example of such a solar cell criteria is a p-n junction. Efficiency is enhanced if the p-n junction is located deep within the substrate, away from the surface of the substrate. The presence of a deep dopant profile also may lower series resistance of the solar cell. This deeper dopant concentration has been previously performed using a high-diffusivity dopant. Such a high-diffusivity dopant may not allow high concentration of the dopant at the surface of the cell without introducing an excessive number of dopant atoms into the silicon, thereby increasing recombination.

By implanting dopants with similar conductivities and differing diffusivities in a solar cell, dopant profiles may be tailored or the thermal steps required to manufacture a solar cell may be minimized. The number of overall thermal steps required also may be reduced. Furthermore, using dopants with different diffusivities may allow both a high surface concentration of a dopant and a high concentration of a dopant deeper in the solar cell, while having the same conductivity throughout the implanted region.

Figure 1B:
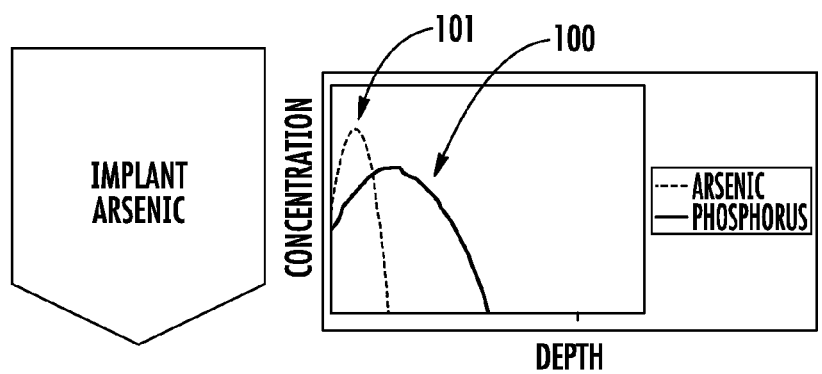
Figure 1C:
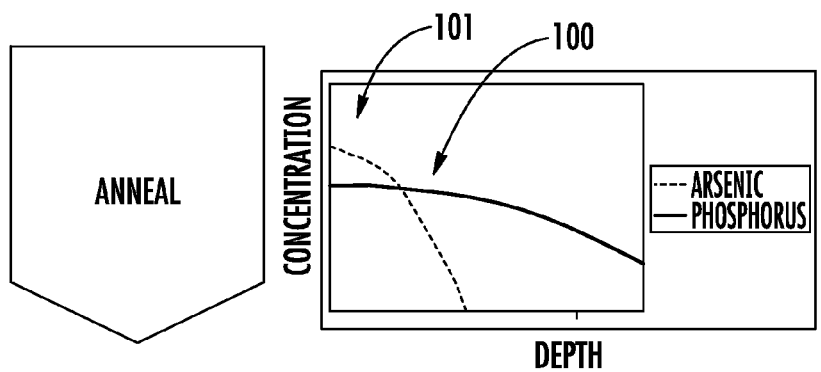

Crystalline silicon solar cell manufacturing typically requires thermal process steps. During thermal process steps, such as an anneal, dopants in the silicon will diffuse and any dopant distribution will change. FIG. 1 is a set of graphs showing representative dopant distribution profiles for phosphorus and arsenic. In FIG. 1A, phosphorus is implanted, while in FIG. 1B, arsenic is implanted. As illustrated in FIG. 1C, the phosphorus dopant distribution 100 and the arsenic dopant distribution 101 change after the anneal, with each diffusing to greater depths.

At least two different dopants are introduced into the silicon matrix of the solar cell. Solar manufacturing has not previously used the different diffusion properties of two or more different dopants to tailor dopant profiles or to optimize solar cell performance. Current solar cell manufacturing methods use only a single dopant.

These at least two dopant species each behave differently during thermal processing. A first dopant species may have a high diffusivity and will diffuse relatively extensively during thermal processing. The second dopant species may have a similar conductivity and may have a lower diffusivity and will diffuse substantially less than the first dopant species during thermal processing. Examples of pairs of n-type dopants are phosphorus and arsenic, phosphorus and antimony, phosphorus and bismuth, and nitrogen, in conjunction with any of the above mentioned dopants. Example of a pairs of p-type dopants are boron and gallium, boron and indium, and boron and aluminum. Other dopant species may be used and this process is not solely limited to the dopants disclosed herein. Similarly, other combinations of the above mentioned dopants, which are not listed herein, may also be used. In one instance, the first dopant in the silicon matrix limits the diffusivity of the second dopant by competing for interstitial or substitutional sites in the crystal lattice. This may result in the second dopant diffusing less than the first dopant. In another embodiment, more than two dopants are used to tailor the dopant profile in the solar cell.

In one instance, during subsequent thermal process steps after the dopants are introduced, such as diffusion or annealing, the first dopant will diffuse more than the second dopant. This enables flexibility in tailoring a dopant profile in a solar cell. For example, using a first and second dopant with different diffusivities may allow charge collection, series resistance, or other solar cell parameters to be optimized. The first dopant may form a deep pn-junction and the second dopant may provide a high dopant concentration at the surface of the solar cell. This may enable various contact designs and may reduce recombination at the surface of the solar cell. Such a configuration also increases charge collection (by minimizing surface recombination) and lowers series resistance.

In one embodiment, the first and second dopants are introduced using ion implantation. A patterned or non-patterned implant may be performed. A patterned implant may use a hard mask or a stencil mask, for example. These two dopants may be introduced at least partially simultaneously using a cluster or molecular implant or by using one or more gases with a tool with no mass separation, such as a plasma doping tool, or a tool that performs a flood implant. For example, a single gas containing both species can be ionized. For example, molecules such as, but not limited to, AsP (arsenic monophosphide), $As_2P_2$ (diarsenic diphosphide), $As_3P$ (Triarsenic phosphide), and $AsP_3$ (arsenic triphosphide) may be used for a molecular implant. Implantation of the four enumerated molecules will result in atomic arsenic ions, and atomic phosphorus ions, where each has a different diffusion rate. Alternatively, two different gaseous species can be ionized simultaneously, such as boron and gallium, or phosphorus and arsenic, yielding ions from each species, which are then at least partially simultaneously implanted.

If the two dopants are introduced at least partially simultaneously, the two dopant species will either have similar depth profiles due to the implant parameters, or they will have dopant profiles where the heavier dopant species has a shallower profile than the lighter dopant species due to the larger size of the heavier dopant species. If the heavier dopant species has a lower diffusivity, such as with arsenic (as compared with phosphorus), the lighter dopant species will have a deeper as-implanted profile and the heavier dopant species will have a shallower as-implanted profile.

In one particular embodiment, a flood implant is used where the ions are not mass analyzed. Both atomic dopant species and molecular dopant species are accelerated. For example, ionized AsP molecules and atomic phosphorus can both be implanted. In this case, the atomic phosphorus atoms would diffuse deepest. Phosphorus atoms from the ionized molecule would be somewhat shallower. Finally, the arsenic atoms from the ionized molecule would be much shallower. Therefore, the atomic dopant species may have a deeper as-implanted dopant profile than the molecular dopant species.

In other embodiments, the two dopants also may be introduced using a chained implant where one dopant is implanted prior to the other dopant. In one particular embodiment, the lighter dopant, such as phosphorus or boron, is implanted first, as it will diffuse deeper into the substrate. The heavier dopant, such as arsenic or gallium, is then implanted. The heavier dopant is likely to be shallower in its diffusion. Furthermore, the earlier implanted ions may occupy some of the available interstitial locations, further limiting the ability of the second implanted species to diffuse deep into the substrate.

In another particular embodiment the heavier dopant can be implanted first (such as As) so as enable amorphization of the substrate over the implanted depth. The lighter dopant such as phosphorous is then implanted. Due to the amorphized substrate, the lighter dopant diffusion is reduced. Following an anneal a more abrupt profile of the lighter dopant can be obtained, which can be beneficial in certain aspects of the cell.

As seen in FIG. 1C, the substrate is annealed after the dopants are introduced into the substrate to activate the dopants and remove any damage to the lattice of the substrate. In the embodiment of FIG. 1, the diffusion profile of the arsenic 101 will be much less than the diffusion profile of the phosphorus 100. Thus, the surface peak dopant profile may be maintained using the arsenic 101 while the deeper dopant profile may be accomplished using the phosphorus 100.

Two dopants also may be introduced using furnace diffusion. In some embodiments, a single gas that contains both dopants, such as those enumerated above, may be introduced during at least one process step. In other embodiments, two or more gases that each contains one dopant may be introduced in at least one process step. During the diffusion, the high-diffusivity dopant, such as phosphorus or boron, will diffuse deeply into the silicon of the solar cell to, for example, form a p-n junction. The low-diffusivity dopant, such as arsenic or gallium, will remain near the surface of the solar cell. To further tailor the dopant profile in the solar cell, one of the two dopant gases may be introduced after one dopant gas has already at least partly diffused into the silicon of the solar cell or after the diffusion of one dopant gas is complete.

In another embodiment, at least one paste is used to obtain the desired dopant profile in the solar cell. In some embodiments, the paste is applied before the antireflective coating has been applied. In other embodiments, paste is applied after the antireflective coating has been applied. Therefore, when paste is applied to the surface of the solar cell, in some embodiments, the paste is applied directly to the substrate, while in other embodiments, the paste is applied to the antireflective coating. In some embodiments, the paste is applied on top of the coating and fired. The heat allows the paste to eat through the coating and reach the substrate, which it diffuses into. The solar cell substrate is coated with the at least one paste that contains one or both dopants. In some embodiments, a paste containing two or more dopants is used. When the substrate is placed in a furnace, the dopants on the surface will diffuse into the substrate. The high-diffusivity dopant will diffuse more than the low-diffusivity dopant. In other embodiments, each paste contains only a single dopant and at least two pastes are used. In this embodiment, the heating process may be repeated to apply the second paste containing a second dopant.

In yet another embodiment, one dopant is introduced by ion implantation and the second dopant is introduced by diffusion while the damage caused by implanting the first dopant is annealed. This may form a retrograde or a flat dopant profile for the dopant introduced by ion implantation and a surface-peaked dopant profile for the diffused dopant. The higher-diffusivity dopant would form a deeper dopant profile than the lower-diffusivity dopant in this embodiment. The selection of which dopant is introduced by ion implantation and which dopant is introduced by diffusion is application specific. Similarly, the order in which the dopants are introduced can also be varied. For example, for a surface peaked monotonically decreasing profile, the high diffusivity species should be implanted. Alternatively, for a profile that has a retrograde feature at some depth, it may be advantageous to implant the low diffusivity species. The disclosure is not limited to a particular configuration or order of operations.

Figure 2:
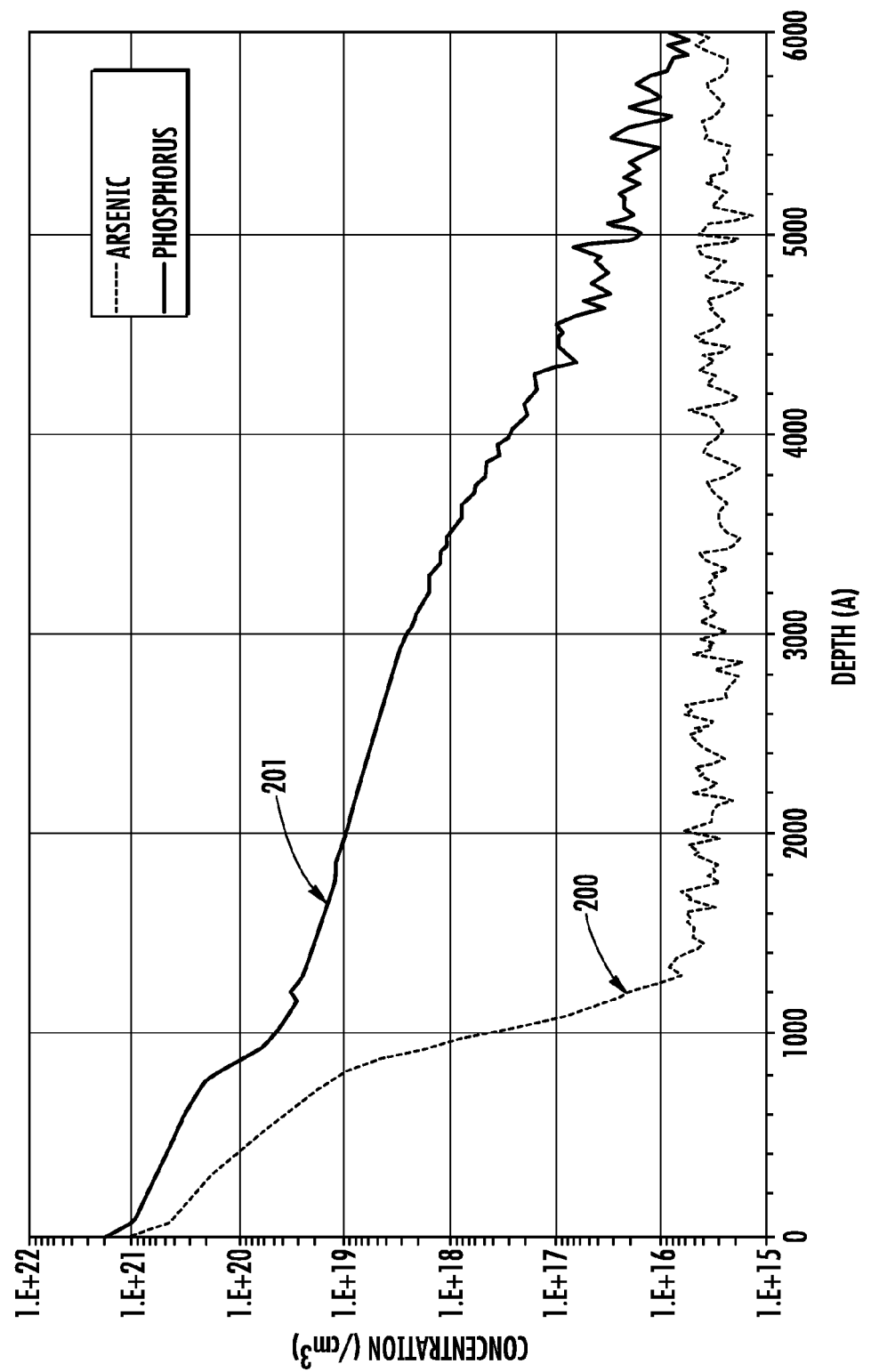
FIG. 2 is a graph comparing dopant concentration versus dopant depth for arsenic and phosphorus.
Figure 3:
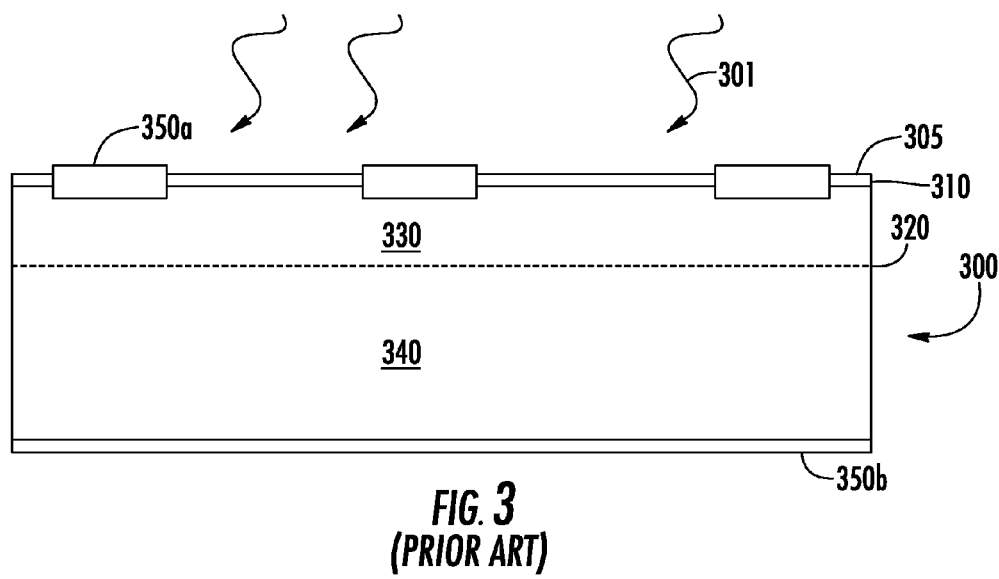
FIG. 3 shows a cross section of a solar cell of the prior art.
Figure 4:
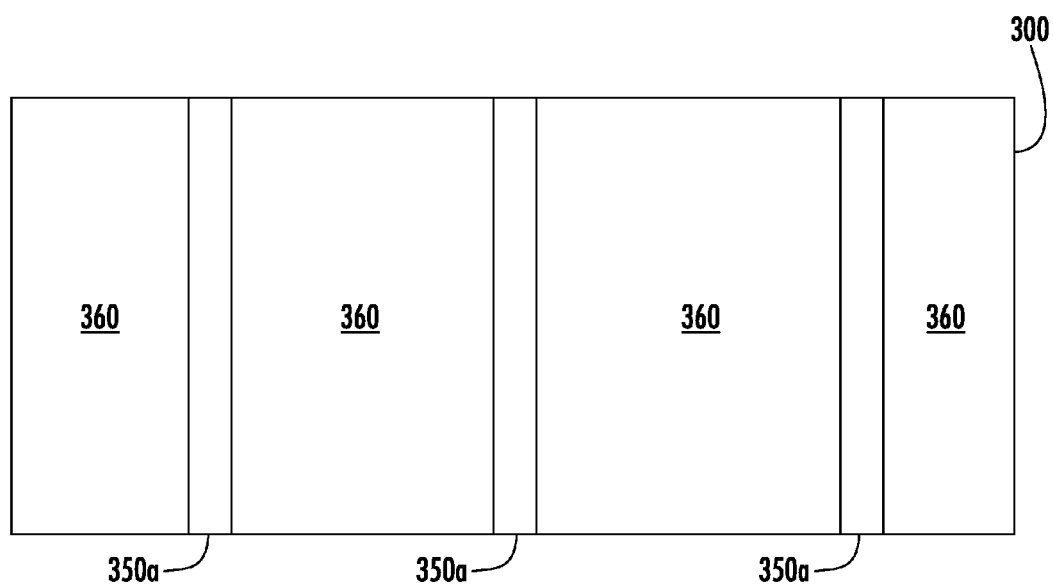
FIG. 4 shows a top view of the solar cell of FIG. 3.
Figure 5:
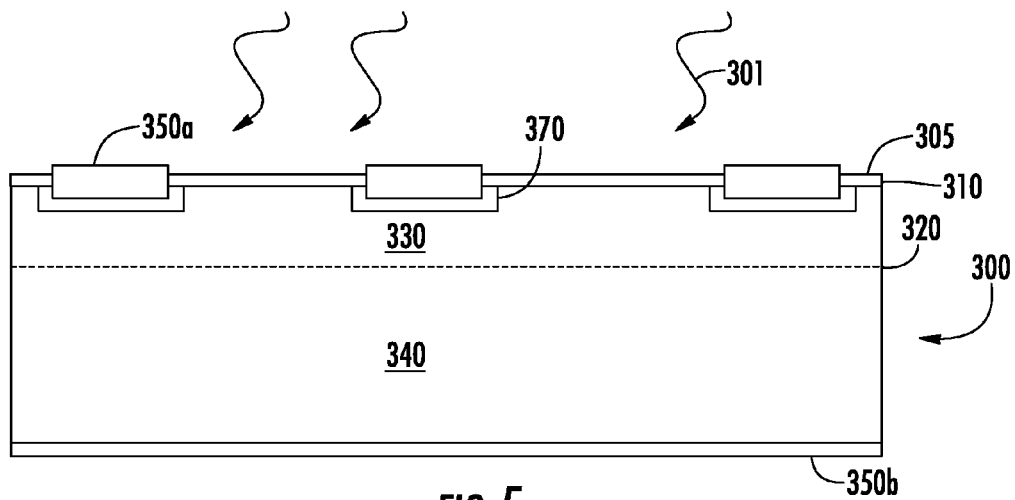
FIG. 5 shows a cross section of a solar cell using selective emitter design.
Figure 6:
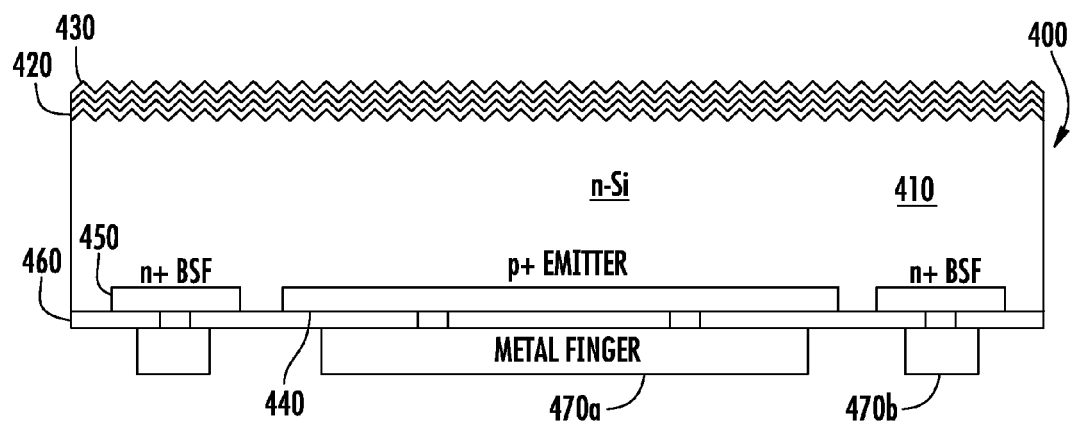
FIG. 6 shows a cross section of a second type of solar cell of the prior art.
Figure 7:
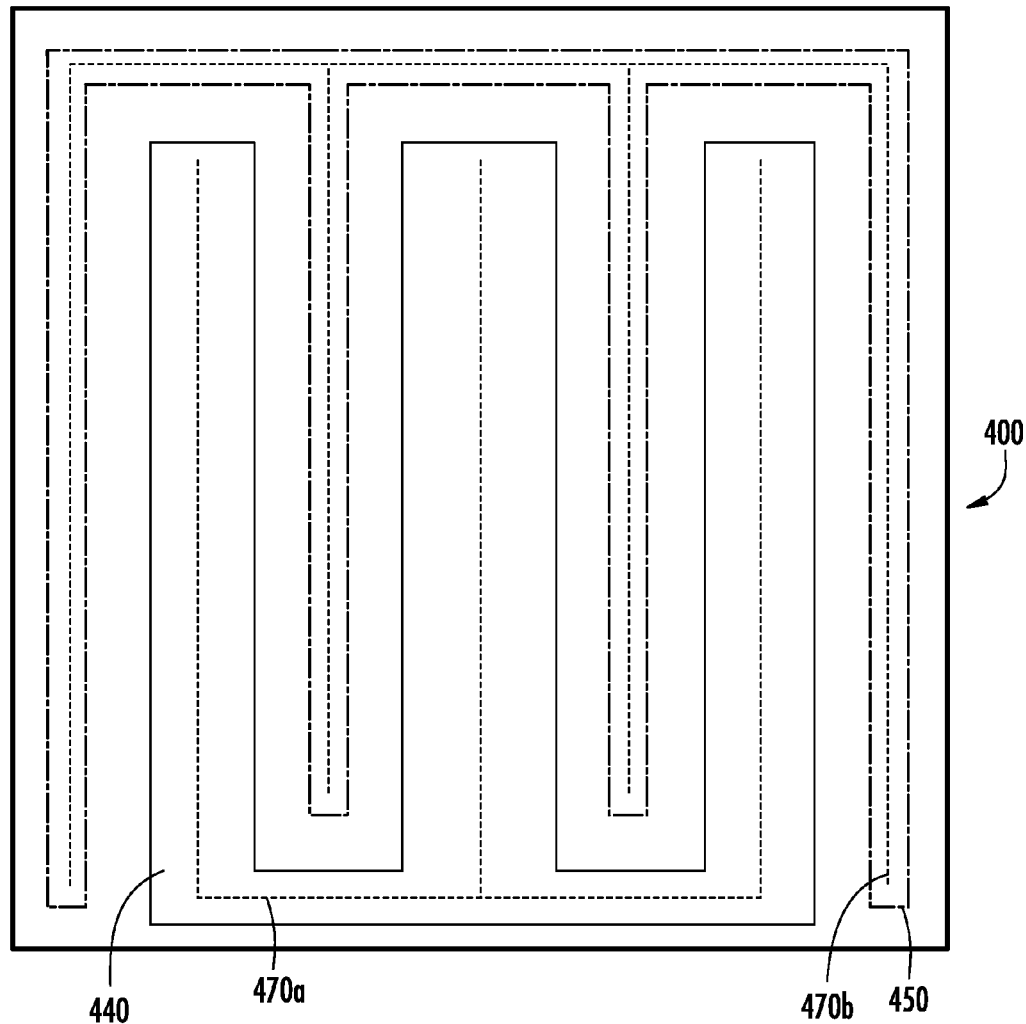
FIG. 7 shows a bottom view of the solar cell of FIG. 6.

FIG. 2 is a graph comparing dopant concentration versus dopant depth for arsenic and phosphorus. This graph may correspond to a secondary ion mass spectrometry (SIMS) profile. As seen in FIG. 2, the arsenic 200 retains a shallow profile while the phosphorus 201 diffuses deeply into the silicon.

In one particular embodiment, the parameters of the anneal are configured to further tailor the dopant profile using at least two dopant species.

The terms and expressions which have been employed herein are used as terms of description and not of limitation, and there is no intention in the use of such terms and expressions of excluding any equivalents of the features shown and described (or portions thereof). It is also recognized that various modifications are possible within the scope of the claims. Other modifications, variations, and alternatives are also possible. Accordingly, the foregoing description is by way of example only and is not intended as limiting.

What is claimed is:

1. A method of creating a desired dopant profile in a solar cell, comprising:
    creating a pn-junction at a desired depth within said solar cell by selectively introducing a first dopant into a region of a surface of said solar cell using patterned ion implantation, wherein said region is less than an entirety of said surface;
    providing a higher dopant concentration at said surface of said solar cell by introducing a second dopant having a similar conductivity and higher diffusivity than said first dopant using diffusion;
    performing a thermal cycle so as to allow said first dopant and said second dopant to diffuse into said solar cell wherein said second dopant diffuses deeper into said solar cell than said first dopant; and
    applying contacts to said solar cell, wherein said contacts are applied to said region with high concentration of said first dopant.

2. The method of claim 1, wherein said first and second dopant are selected from the group consisting of nitrogen, phosphorus, arsenic, antimony, bismuth, boron, aluminum, gallium, and indium.

3. The method of claim 1, wherein said second dopant is introduced using said diffusion during said thermal cycle.

4. The method of claim 1, wherein said patterned ion implantation uses a stencil mask.

5. A method of creating a desired dopant profile in a substrate comprising:
    introducing a first dopant using patterned ion implantation into a region of a surface of said substrate, wherein said region is less than an entirety of said surface;
    performing a thermal cycle so as to allow said first dopant to diffuse into said substrate;
    introducing a second dopant into said surface while said thermal cycle is being performed, said second dopant having a similar conductivity and different diffusivity than said first dopant; and
    applying contacts to said region with high concentration of said first dopant.

6. The method of claim 5, wherein said patterned ion implantation uses a stencil mask.

7. The method of claim 5, wherein said first and second dopant are selected from the group consisting of nitrogen, phosphorus, arsenic, antimony, bismuth, boron, aluminum, gallium, and indium.

8. The method of claim 5, wherein said first dopant has a lower diffusivity than said second dopant.

9. The method of claim 5, wherein said first dopant has a same conductivity as said second dopant, and one of said first dopant or said second dopant diffuses deeper into said solar cell than the other of said first dopant and said second dopant so as to create a pn-junction at a desired depth within a solar cell, while the other of said first dopant and said second dopant creates a greater dopant concentration at a surface of said solar cell.

* * * * *